United States Patent
Lencioni

(10) Patent No.: US 6,819,159 B1
(45) Date of Patent: Nov. 16, 2004

(54) LEVEL SHIFTER CIRCUIT

(75) Inventor: Michael J. Lencioni, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,653

(22) Filed: Apr. 29, 2003

(51) Int. Cl.[7] ................................................ H03L 5/00
(52) U.S. Cl. ...................................... 327/333; 326/81
(58) Field of Search ..................... 327/333, 55; 326/62, 326/63, 68, 80, 81

(56) References Cited

U.S. PATENT DOCUMENTS

| | | | | |
|---|---|---|---|---|
| 3,356,858 A | * | 12/1967 | Wanlass | ...................... 326/103 |
| 5,559,996 A | * | 9/1996 | Fujioka | ......................... 703/23 |
| 6,373,315 B2 | * | 4/2002 | Tsuji et al. | ................... 327/333 |
| 6,512,407 B2 | * | 1/2003 | Horan et al. | ................. 327/333 |
| 6,563,362 B2 | * | 5/2003 | Lambert | ...................... 327/333 |
| 6,661,274 B1 | * | 12/2003 | Naka et al. | ................... 327/333 |
| 2003/0062939 A1 | * | 4/2003 | Tanaka et al. | ............... 327/202 |

* cited by examiner

*Primary Examiner*—Quan Tra
(74) *Attorney, Agent, or Firm*—Richard A. Henkler; Dillon & Yudell LLP

(57) ABSTRACT

A level shifter circuit is disclosed. The level shifter circuit includes a first level shifter circuit and a second level shifter circuit. The first level shifter circuit and the second level shifter circuit are substantially identical with each other. The second level shifter circuit coupled to the first level shifter circuit via a couple of transistor to provide an output and a complementary output, respectively.

6 Claims, 2 Drawing Sheets

LEVEL SHIFTER CIRCUIT

BACKGROUND OF INVENTION

1. Technical Field

The present invention relates to electronic circuits in general, and in particular, to level shifter circuits. Still more particularly, the present invention relates to a level shifter circuit having improved characteristics in low to high voltage conversion operations.

2. Description of the Related Art

Modern integrated circuit (IC) devices often have to interface with IC devices from previous technology generations. However, the complementary metal-oxide semiconductor (CMOS) voltage levels on IC devices from previous technology generations are usually different from those on IC devices from the current technology generation. Thus, in order to ensure proper interfacing between different CMOS voltage levels, modern IC devices must include output buffer circuits that are capable of driving voltages greater or less than the source voltage.

Generally speaking, an output buffer circuit includes a level shifter circuit that is coupled to a power supply having a voltage different from the source voltage. In response to the values of the input signals, the level shifter circuit uses a set of output drivers to provide output voltages accordingly. For example, an output buffer circuit that receives input signals ranging from 0 V to 0.7 V output is capable of providing output signals ranging from 0 V to 3.3 V, accordingly.

The present disclosure describes a level shifter circuit having improved characteristics in low to high voltage transition operations.

SUMMARY OF INVENTION

In accordance with a preferred embodiment of the present invention, a level shifter circuit includes a first level shifter circuit and a second level shifter circuit. The first level shifter circuit and the second level shifter circuit are substantially identical with each other. The second level shifter circuit is coupled to the first level shifter circuit via a couple of transistors to provide an output and a complementary output, respectively.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
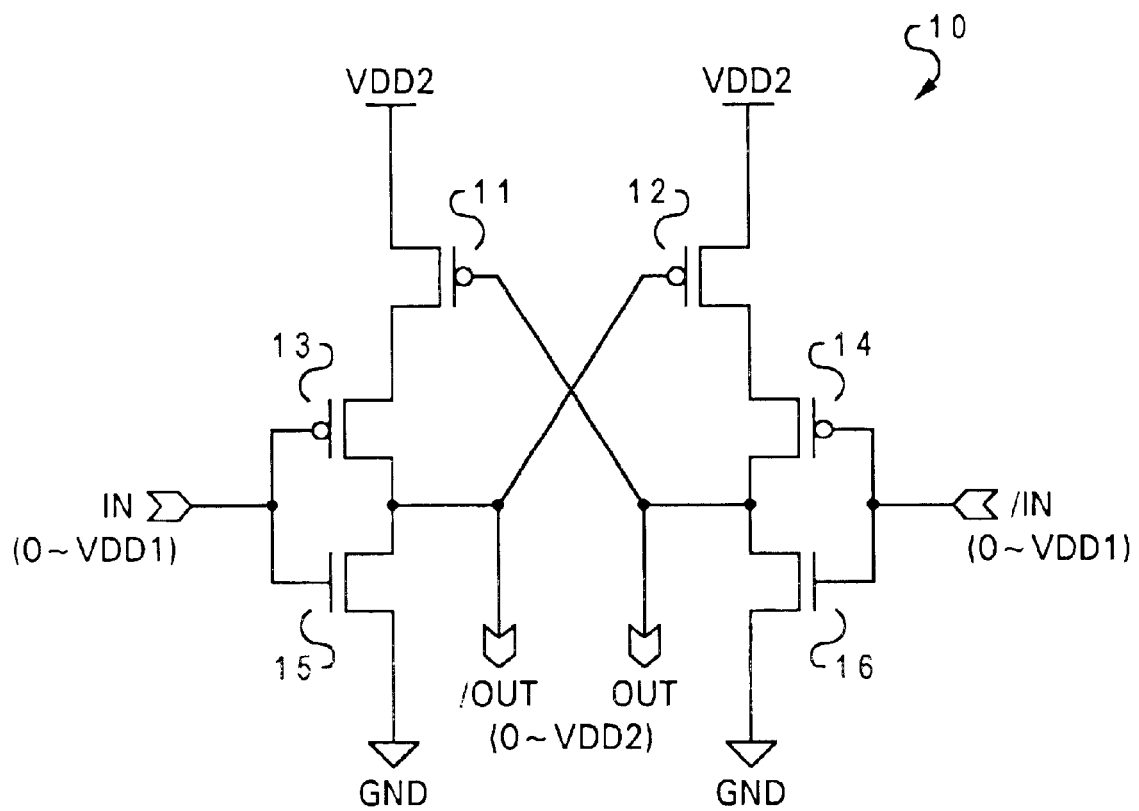
FIG. 1 is a circuit diagram of a level shifter circuit according to the prior art.

Referring now to the drawings, and in particular, to FIG. 1, there is depicted a circuit diagram of a level shifter circuit according to the prior art. As shown, a level shifter circuit 10 includes a p-channel transistor 11 and a p-channel transistor 12 having its respective source connected to a power source $V_{DD}2$. Also, the drain of p-channel transistor 11 is connected to the source of a p-channel transistor 13, and the drain of p-channel transistor 12 is connected to the source of a p-channel transistor 14. The drain of p-channel transistor 13 is connected to the gate of p-channel transistor 12 and to the drain of an n-channel transistor 15. The drain of p-channel transistor 14 is connected to the gate of p-channel transistor 11 and to the drain of an n-channel transistor 16. Both the source of n-channel transistor 15 and the source of n-channel transistor 16 are connected to ground.

An input signal IN is fed to the gate of p-channel transistor 13 and to the gate of n-channel transistor 15 while a complementary input signal /IN is fed to the gate of p-channel transistor 14 and to the gate of n-channel transistor 16. An output signal OUT can be extracted from the drain of p-channel transistor 14 and the drain of n-channel transistor 16. Similarly, a complementary output signal /OUT can be extracted from the drain of p-channel transistor 13 and the drain of n-channel transistor 15.

Level shifter circuit 10 converts an input signal IN having a voltage amplitude ranging from 0 to $V_{DD}1$ into an output signal OUT having a voltage amplitude ranging from 0 to $V_{DD}2$. During operation, when the electric potential of the input signal IN is at a logical high of $V_{DD}1$, n-channel transistor 15 is turned on and p-channel transistor 13 is turned off, the electric potential of 0 V (i.e., logical low) is fed to the gate of p-channel transistor 12 to turn p-channel transistor 12 on. On the other hand, the electric potential of the complementary input signal /IN is at a logical low of 0 V, and thus n-channel transistor 16 is turned off while p-channel transistor 14 is turned on. Therefore, both p-channel transistors 12 and 14 are turned on and the electric potential is shifted such that the output signal OUT becomes $V_{DD}2$. It is to be noted that p-channel transistor 11 is turned off to ensure that the gate of p-channel transistor 12 is held at a logical low of GND.

In contrast, when the electric potential of the input signal IN to level shifter circuit 10 is at a logical low of 0 V, the electric potential of 0 V occurs at output OUT. Accordingly, an input signal having a voltage amplitude of 0 to $V_{DD}1$ can be converted to an output signal having a voltage amplitude of 0 to $V_{DD}1$.

Level shifter circuit 10 can easily perform voltage level conversions between voltage amplitudes having small differences. However, as the difference between voltage amplitudes becomes larger and as $V_{DD}1$ approaches the threshold voltage of n-channel transistors, it becomes more difficult for level shifter circuit 10 to perform voltage level conversions, resulting in problems as follows.

Assume $V_{DD}1$ and $V_{DD}2$ of level shifter circuit 10 to be 1.2 V and 5.0. Also assume the threshold voltages of p-channel transistors 11–14 are −0.9 V, and threshold voltages of n-channel transistors 15–16 are 0.9 V. Under such conditions in a steady state of a normal operating condition, if the electric potential of the input signal IN is changed from a logical low of 0 V to a logical high of 1.2 V, then the voltage between the gate and the source of n-channel transistor 15 exceeds the threshold voltage of n-channel transistor 15, thereby turning n-channel transistor 15 on. In addition, because the source electric potential of p-channel transistor 13 is initially 5 V, the voltage between the gate and the source p-channel transistor 13 is −4.1 V, which exceeds the threshold voltage of p-channel transistor 13. Thus, p-channel transistor 13 is turned on. P-channel transistor 11 is also turned on initially, and therefore a penetrating current flows between the voltage source $V_{DD}2$ and GND through p-channel transistors 11, 13 and n-channel transistor 15. Such condition continues as long as either p-channel transistor 11 or p-channel transistor 13 is not turned off.

Furthermore, as the voltage of voltage source $V_{DD}1$ gets closer to the threshold voltage of a n-channel transistor, the drive strength of the n-channel transistor dramatically decreases in accordance with the various process and temperature conditions. As a result, the effectiveness of level shifter circuit 10 is reduced.

Figure 2:
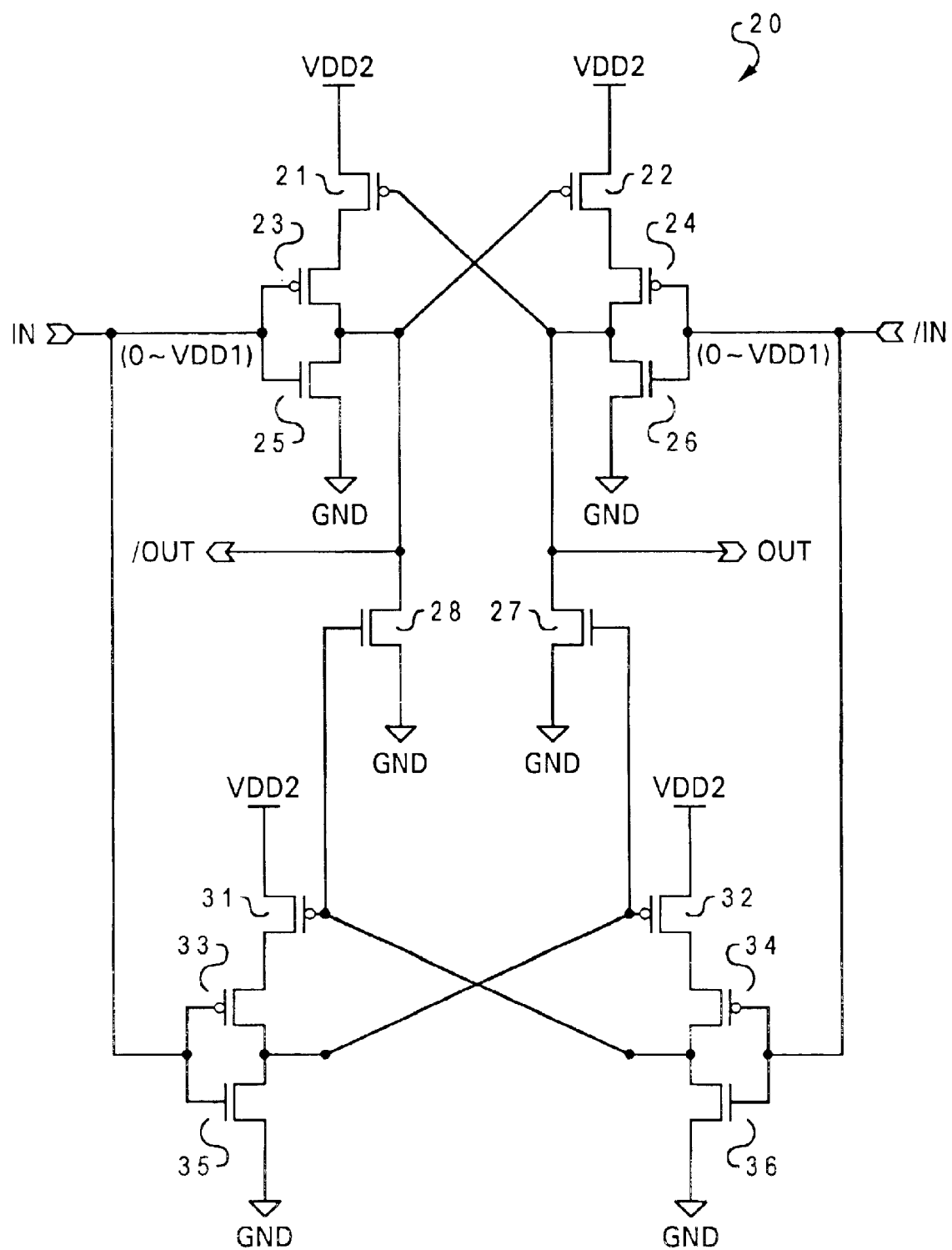
FIG. 2 is a circuit diagram of a level shifter circuit in accordance with a preferred embodiment of the present invention.

With reference now to FIG. 2, there is depicted a circuit diagram of a level shifter circuit, in accordance with a preferred embodiment of the present invention. As shown, a level shifter circuit 20 includes a primary level shifter circuit and a secondary level shifter circuit. The primary level shifter circuit includes p-channel transistors 21–24 and n-channel transistors 25–26. The secondary level shifter circuit includes p-channel transistors 31–34 and n-channel transistors 35–36. The primary level shifter circuit is coupled to the secondary level shifter circuit via n-channel transistors 27–28.

For the primary level shifter circuit, both the source of p-channel transistor 21 and the source of p-channel transistor 22 are connected to a power source $V_{DD}2$. Also, the drain of p-channel transistor 21 is connected to the source of p-channel transistor 23, and the drain of p-channel transistor 22 is connected to the source of p-channel transistor 24. The drain of p-channel transistor 23 is connected to the gate of p-channel transistor 22, the drain of n-channel transistor 25 and the drain of n-channel transistor 28. The drain of p-channel transistor 24 is connected to the gate of p-channel transistor 21, the drain of n-channel transistor 26 and the drain of n-channel transistor 27. The sources of n-channel transistors 25–28 are all connected to ground.

For the secondary level shifter circuit, both the source of p-channel transistor 31 and the source of p-channel transistor 33 are connected to power source $V_{DD}2$. The drain of p-channel transistor 31 is connected to the source of p-channel transistor 33, and the drain of p-channel transistor 33 is connected to the source of p-channel transistor 34. The drain of p-channel transistor 33 is connected to the drain of n-channel transistor 35, the gate of p-channel transistor 32 and the gate of n-channel transistor 27. The drain of p-channel transistor 34 is connected to the drain of n-channel transistor 36, the gate of p-channel transistor 31 and the gate of n-channel transistor 28. The sources of n-channel transistors 35–36 are connected to ground.

An input signal IN can be fed to the gates of p-channel transistors 23, 33 and the gates of n-channel transistors 25, 35 while a complementary input signal /IN can be fed to the gates of p-channel transistors 24, 34 and the gates of n-channel transistors 26, 36 to extract an output signal OUT from the drain of n-channel transistor 27. Similarly, a complementary output signal /OUT can be extracted from the drain of n-channel transistor 28.

For level shifter circuit 20, input signals IN switch from 0 V to $V_{DD}1$ and output signals OUT switch from 0 V to $V_{DD}2$, accordingly. $V_{DD}1$ is generally less than $V_{DD}2$. For example, $V_{DD}1$ equals 0.7 V and $V_{DD}2$ equals 3.3 V.

When input signal IN switches from a logical 0 to a logical 1, transistors 25, 35 are turned on, and transistors 23, 33 are turned off. In turn, transistors 22 and 32 are turned on. On the other hand, transistors 24, 34 are turned on, and transistors 26, 36 are turned off. Consequently, transistors 27 and 37 are turned off. Thus, transistor 27 is turned off and transistor 28 is turned on. As a result, a logical 1 (i.e., $V_{DD}2$) occurs at output OUT, and a logical 0 (i.e., GND) occurs at complementary output /OUT.

When input signal IN switches from a logical 1 to a logical 0, transistors 25, 35 are turned off, and transistors 23, 33 are turned on. In turn, transistors 22 and 32 are turned off. On the other hand, transistors 24, 34 are turned off, and transistors 26, 36 are turned on. Consequently, transistors 27 and 37 are turned on. Thus, transistor 27 is turned on and transistor 28 is turned off. As a result, a logical 0 (i.e., GND) occurs at output OUT, and a logical 1 (i.e., $V_{DD}2$) occurs at complementary output /OUT.

As has been described, the present invention provides a level shifter circuit having improved characteristics in low to high voltage transition operations. The primary advantage of the present invention is that output transistors, such as n-channel transistors 27 and 28, are able to receive a full $V_{DD}2$ voltage at their respective gates, which can increase their drive strength.

While the invention has been particularly shown and described with reference to a preferred embodiment, it will be understood by those skilled in the art that various changes in form and detail may be made therein without departing from the spirit and scope of the invention.

What is claimed is:

1. A level shifter circuit comprising:
    a primary level shifter circuit having a first invertor circuit coupled to said power source via a first p-channel transistor, and a second invertor circuit coupled to said power source via a second p-channel transistor, wherein an output of said first invertor circuit is connected to a gate of said second p-channel transistor, and an output of said second invertor circuit is connected to a gate of said first p-channel transistor, wherein each of the first and second invertor circuits comprises an n-channel transistor and a p-channel transistor; and
    a secondary level shifter circuit substantially identical to said primary level shifter circuit, wherein said secondary level shifter circuit is coupled to said primary level shifter circuit via a first driver transistor to provide an output and a second driver transistor to provide an complementary output.

2. The circuit of claim 1, wherein said secondary level shifter circuit includes a third invertor circuit coupled to said power source via a third p-channel transistor, and a second invertor circuit coupled to said power source via a fourth p-channel transistor.

3. The circuit of claim 2, wherein an output of said third invertor circuit is connected to a gate of said fourth p-channel transistor, and an output of said third invertor circuit is connected to a gate of said third p-channel transistor.

4. The circuit of claim 3, wherein one of said first and second driver transistors is connected between said output of said second invertor circuit and output of said third invertor circuit to provide said output.

5. The circuit of claim 4, wherein another one of said first and second driver transistors is connected between said output of said first invertor circuit and output of said fourth invertor circuit to provide said complementary output.

6. The circuit of claim 5, wherein said first and second driver transistors are n-channel transistors.

* * * * *

UNITED STATES PATENT AND TRADEMARK OFFICE
CERTIFICATE OF CORRECTION

PATENT NO. : 6,819,159 B1
DATED : November 16, 2002
INVENTOR(S) : Lencioni

It is certified that error appears in the above-identified patent and that said Letters Patent is hereby corrected as shown below:

Column 2,
Lines 38-44, please replace with the following:
-- In contrast, when the electric potential of the input signal IN to level shifter circuit 10 is at a logical low of 9 V, the electric potential of 0 V occurs at output OUT. Accordingly, an input signal having a voltage amplitude of 0 to $V_{dd}1$ can be converted to an output signal having a voltage amplitude of 0 to $V_{dd}2$. --.

Signed and Sealed this

Twenty-third Day of August, 2005

JON W. DUDAS
*Director of the United States Patent and Trademark Office*